United States Patent [19]

O'Toole

[11] 4,338,679

[45] Jul. 6, 1982

[54] ROW DRIVER CIRCUIT FOR SEMICONDUCTOR MEMORY

[75] Inventor: James E. O'Toole, Carrollton, Tex.

[73] Assignee: Mostek Corporation, Carrollton, Tex.

[21] Appl. No.: 273,845

[22] PCT Filed: Dec. 24, 1980

[86] PCT No.: PCT/US80/01727

§ 371 Date: Dec. 24, 1980

§ 102(e) Date: Dec. 24, 1980

[51] Int. Cl.³ ............................................. G11C 11/40
[52] U.S. Cl. ................................... 365/203; 365/190; 365/233
[58] Field of Search ............... 365/233, 203, 182, 189, 365/190

[56] References Cited

U.S. PATENT DOCUMENTS

| | | | |
|---|---|---|---|
| 3,832,699 | 8/1974 | Matsue | 365/189 |
| 3,906,461 | 9/1975 | Cappon | 365/189 |
| 4,204,277 | 5/1980 | Kinoshita | 365/203 |
| 4,255,679 | 3/1981 | White, Jr. et al. | 365/203 |
| 4,281,399 | 7/1981 | Yamamoto | 365/189 |

*Primary Examiner*—Terrell W. Fears

[57] ABSTRACT

A circuit (10) is disclosed for use in a semiconductor integrated circuit memory. The integrated circuit memory includes row lines (102-108) which serve to activate the access transistors for memory cells (102a-108a) within the memory circuit. A row decoder circuit (36) receives a plurality of first address bits and produces a drive signal output when the decoder circuit is selected. A transition detector circuit (24) produces a transition signal whenever the state of any of the address bits is changed. A clock decoder circuit receives a plurality of second address bits together with the transition signal to produce a selected clock signal ($\phi_A$-$\phi_D$). The combination of the transition signal and the output of the row decoder circuit (36) serves to precharge the gate terminals of the row driver transistors (80-86) for the row lines (102-108). The selected row line receives the active state of the clock signal ($\phi_A$-$\phi_D$) which causes the gate terminal of the selected row driver transistor to be capacitively coupled to a higher voltage than the clock signal to therefore supply the full clock signal voltage to the row line (102-108). The voltage on the row line then activates the access transistors (118, 120) for the memory cells (106a) on the row line (106). This enables a maximum charge to be stored in or read from the memory cell (106a).

6 Claims, 2 Drawing Figures 4,338,679

ROW DRIVER CIRCUIT FOR SEMICONDUCTOR MEMORY

TECHNICAL FIELD

The present invention pertains to semiconductor integrated circuits and more particularly to a row driver circuit for a semiconductor memory.

BACKGROUND OF THE INVENTION

In semiconductor integrated circuit memories, both static and dynamic, memory calls are typically accessed by charging a row line which is connected to a plurality of access transistors for the memory cells. Each of the access transistors presents a capacitive loading on the row line. The row lines are typically polysilicon and offer a significant impedance to the charging signal. It can be seen that as semiconductor memories become larger more power is required to drive the row lines due to increased capacitive loading as well as the resistance of the row line itself, if the cycle time of the memory is not to be reduced.

It has typically been the approach to this problem to fabricate a bigger driver circuit with more and large transistors for handling the greater load. This, however, presents more problems since, with more dense circuits and smaller geometries, less room is available for row driver circuits. Further the larger driver circuits themselves require more powerful decoder and buffer circuits which again increases the power and area of the integrated circuit.

Therefore, in view of these problems, there exists a need for a row driver circuit for static and dynamic memories wherein the problems of capacitive loading, excessive power consumption and access time are overcome.

SUMMARY OF THE INVENTION

An illustrative embodiment of a row driver circuit of the present invention includes a row driver transistor for each of the row lines of a semiconductor memory. Each of the row driver transistors has a drain terminal, a source terminal and a gate terminal and the source terminal of each of the row driver transistors is connected to the corresponding row line. A row decoder circuit is provided for receiving a plurality of first address bits and generating therefrom a drive signal at the output terminal when the row decoder circuit is selected by the first address bits. A transition detector circuit is provided for receiving the row address bits provided to the memory and generating therefrom a transition signal having a preset duration of the active state when there is a change of state for any one of the address bits. A circuit is further provided which is responsive to the drive signal for holding at a fixed potential, ground, a group of row lines corresponding to the row line decoder. Further circuit means are provided which are responsive to the transition signal for connecting the output terminal of the row decoder to the gate terminals of the corresponding row driver transistors wherein the gate terminals of the row driver transistors are charged when the first address bits select the row decoder circuit and the active state of the transition signal is generated. The circuit then selectively isolates the charged gate terminals to permit capacitive coupling. A clock decoder circuit is connected to receive a plurality of second address bits and the transition signal for generating therefrom any one of a plurality of clock signals at the respective output terminals thereof. The output terminals of the clock decoder are respectively connected to the drain terminals of the row driver transistors for capacitively coupling the voltage on the precharged gate terminals of the corresponding row driver transistors to thereby charge the corresponding row line to at least the voltage of the clock signal.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
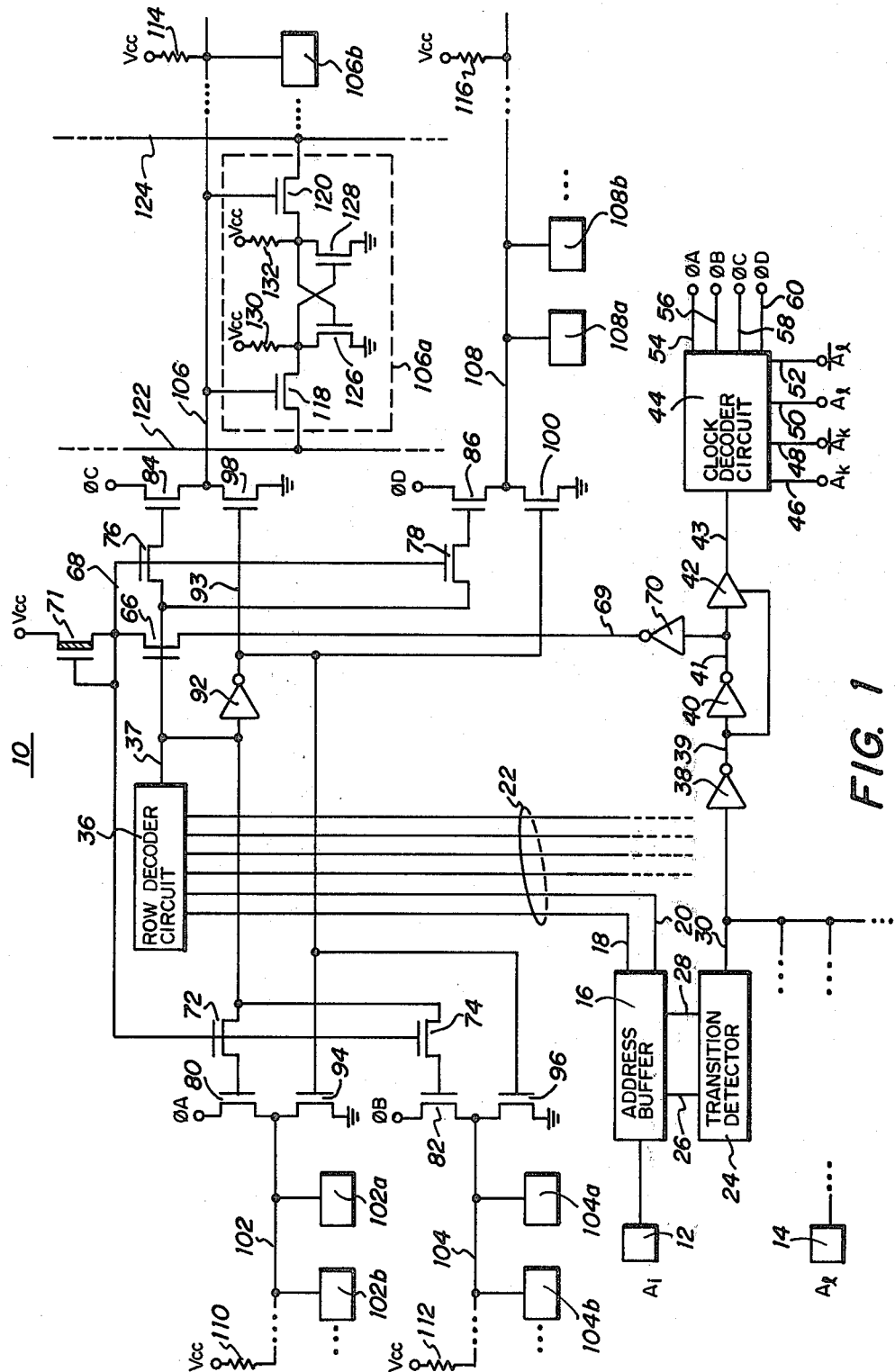
FIG. 1 is a block and schematic illustration of a row driver circuit for use with the semiconductor memory having static memory cells.

Referring to FIG. 1 there is illustrated a circuit 10 which includes the row driver circuitry of the present invention. The memory cells in a semiconductor memory are accessed by providing an address to the memory circuit. This address comprises a plurality of address bits which specify the location of the desired memory cell. The memory circuit 10 is provided with address bits $A_i$, $A_j$, $A_k$ and $A_l$. Only four address bits are shown to illustrate one embodiment of the present invention, however, a greater number of address bits can be utilized in the same manner as that described herein.

The address bit $A_i$ is provided to an input terminal 12 while the address bit $A_j$ is provided to an input terminal 14. The remaining address bits are supplied to other input terminals similar to 12 and 14. The address bits $A_i$ and $A_j$ comprise a first set of address bits which in the general application of the present invention can have any number of bits therein. A representative circuit is illustrated for receiving the address bit $A_i$. Similar circuits are provided for each of the remaining bits in the address. Input terminal 12 is connected to an address buffer 16 which receives and stores the input address bit while generating the positive and complement of the received address bit. The positive and complement of the address bit are transmitted respectively on lines 18 and 20, which are two of a group of lines 22 which receive the address bits in the first set.

A transition detector circuit 24 is connected via lines 26 and 28 to the address buffer 16. The transition detector circuit, essentially a one-shot circuit, generates a transition signal at terminal 30 when the state of the address bit in buffer 16 is changed. For each of the address bits there is an address buffer and, transition detector as described above. The outputs of all of the transition detectors are connected in common at terminal 30. The transition detectors comprise a transition detector circuit which produces a transition signal when the state of a row address bit changes.

The address lines 22 are connected to a row decoder circuit 36 which produces a drive signal on an output node 37 when the row decoder circuit is selected by the address bits in the first set. The row decoder circuit 36 is typically either a "tree" or a NOR circuit as is commonly known in the art.

The terminal 30 from the transition detector 24 is connected to the input of an inverter 38 which has the output thereof connected through a node 39 to an inverter 40 and to an amplifier 42. The output of inverter 38 is used to precharge the amplifier 42. The amplifier 42 is precharged to generate a clock signal such as is done with dynamic random access memories. The precharging serves to reduce power consumption and could be eliminated if amplifier 42 were replaced with conventional buffers but this would increase power consumption.

The output of amplifier 42 is connected through a node 43 to a clock decoder circuit 44 which receives a second set of address bits together with the complements thereof at a plurality of input terminals 46–52. The address bits and complements are derived from the corresponding address buffers. The address bit $A_k$ and its complement are provided respectively to terminals 46 and 48 and the address bit $A_l$ and its complement are provided respectively to input terminals 50 and 52. The clock decoder circuit 44 produces a plurality of clock signals $\phi_A$, $\phi_B$, $\phi_C$ and $\phi_D$ respectively on output lines 54–60.

The output node 37 of the row decoder circuit 36 is connected to the gate terminal of a transistor 66 which has the drain terminal thereof connected to a node 68 and source terminal connected to the output of an inverter 70 which has the input thereof connected to receive the output of inverter 40 through a node 41.

A depletion mode transistor 71 has the gate and source terminals thereof connected to node 68 and the drain terminal thereof connected to the supply voltage source $V_{cc}$. Transistor 71 functions as a load impedance.

The output node 37 of the row decoder circuit 36 is connected to the drain terminals of a plurality of isolation transistors 72, 74, 76 and 78. The gate terminals for the isolation transistors are connected to node 68. The source terminals of transistors 72–78 are connected respectively to the gate terminals of a plurality of drive transistors 80–86.

The output terminal 37 of the row decoder circuit 36 is further connected to the input of an inverter 92. The output of inverter 92 is connected to the gate terminals of a plurality of pull down transistors 94, 96, 98 and 100. The source terminals for each of the pull down transistors 94–100 are connected to a common node which in the preferred embodiment is circuit ground. The drain terminals for the pull down transistors are connected respectively to a plurality of row lines 102, 104, 106 and 108. In a preferred embodiment of the invention the row lines 102–108 are each halves of a complete row line. The combination of row lines 102 and 106 form a complete row line for the semiconductor memory. Likewise the row lines 104 and 108 comprise a complete row line. The row driver circuit of the present invention can be used both with split row lines as described immediately above or with independent row lines as shown in FIG. 1.

The row lines 102–108 are connected respectively to the source terminals of row driver transistors 80–86. The drain terminals of the row driver transistors are connected respectively to receive the clock signals $\phi_A$, $\phi_B$, $\phi_C$ and $\phi_D$. The clock signals are generated by the clock decoder circuit 44. Each clock signal is driven to a high state which is approximately equal to the supply $V_{cc}$.

Each of the row lines 102–108 is connected to a first terminal respectively of a like plurality of resistors 110, 112, 114 and 116. The second terminal of each of the resistors 110–116 is connected to the supply voltage $V_{cc}$.

Each of the row lines is a conductive path which is connected to the access transistors for a plurality of memory cells. The row lines 102–108 are provided with representative memory cells 102a–108a and 102b–108b. These are merely representative memory cells and a substantial number of memory cells, such as, for example, 64 or 128, can be connected to a single row line.

The row driver circuit of the present invention is adaptable to work with either static or dynamic memory cells. An exemplary static memory cell 106a is illustrated in detail. Memory cell 106a has two access transistors 118 and 120 which have the gate terminals connected to the row line 106. The drain terminals of transistors 118 and 120 are connected respectively to two column lines 122 and 124. The source terminals of access transistors 118 and 120 are connected respectively to the drain terminals of two transistors 126 and 128. The drain terminal of transistor 126 is connected through a resistor 130 to the voltage supply $V_{cc}$. Likewise the drain terminal of transistor 128 is connected through a resistor 132 to the voltage supply $V_{cc}$. The source terminals of transistors 126 and 128 are both connected to the common node ground. The gate of transistor 126 is connected to the drain terminal of transistor 128 and the gate terminal of transistor 128 is connected to the drain terminal of transistor 126. This interconnection of the gate terminals forms a bistable circuit wherein information is stored in the memory cell as one of two data states. When the row line 106 is charged, the access transistors 118 and 120 are rendered conductive to connect the corresponding column lines 122 and 124 to the drain terminals of transistors 126 and 128. When the memory cell 106 is being read the charge state on the transistors 126 and 128 is propagated through the access transistors to the column lines 122 and 124. But when a data state is being written into the memory cell one of the column lines 122 and 124 is charged and the charge state is transferred through the corresponding access transistor to set the state of the two transistors 126 and 128. The access transistors are then deactivated to isolate the charge state of the memory cell.

Column lines such as 122 and 124 are provided for use with the remainder of the memory cells in the semiconductor memory although additional column lines are not illustrated.

Figure 2:
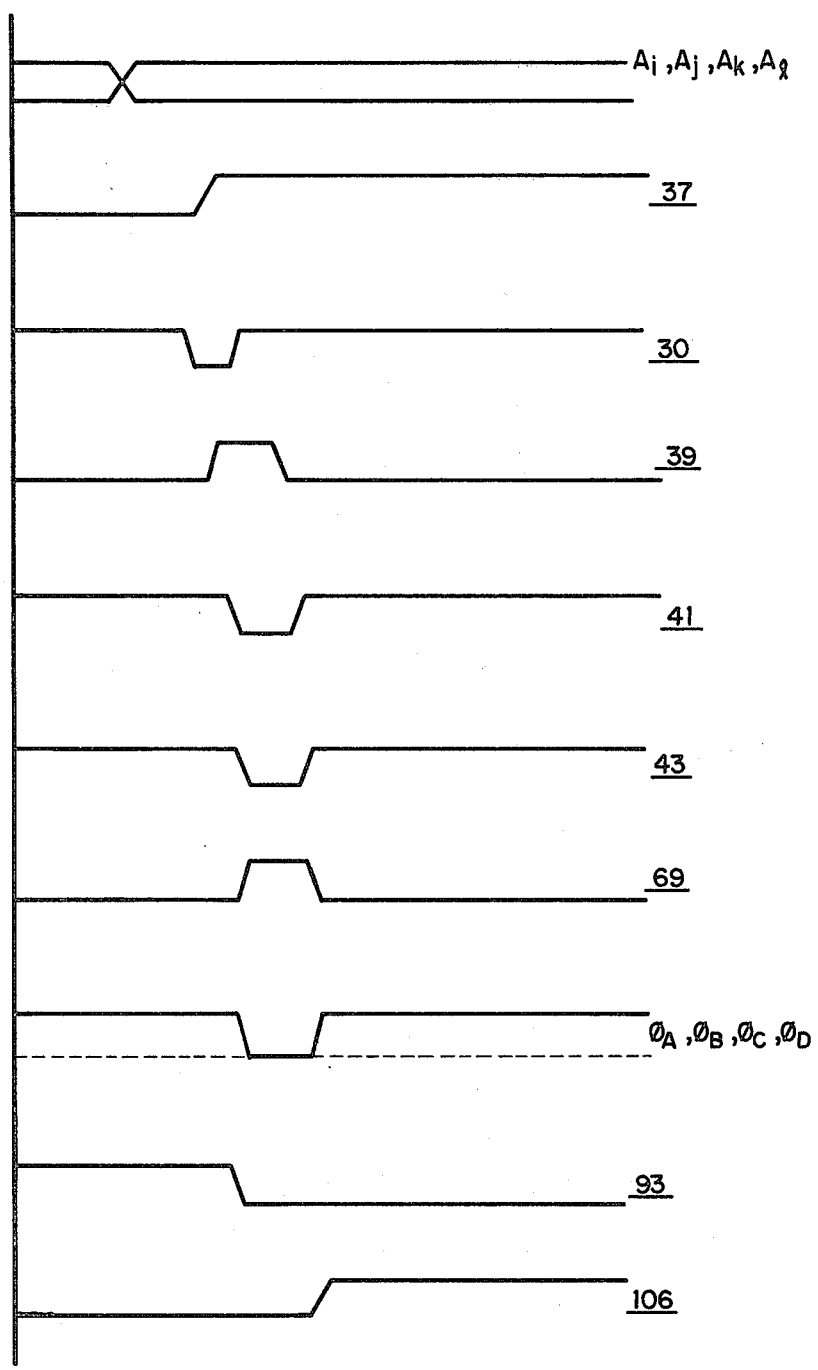
FIG. 2 is an illustration of selected signals which occur in the schematic diagram shown in FIG. 1.

Various waveforms which are present in the circuit illustrated in FIG. 1 are shown in FIG. 2. The wave forms illustrated in FIG. 2 are shown to illustrate the relative timing in operation of the circuit 10 and are referenced to the nodes at which they occur.

In the embodiment illustrated in FIG. 1 there are two bits in the first set of address bits and two bits in the second set of address bits. However, in the general application of the present invention the address bits can be divided in any way between the first and second sets including having no bits in one set.

Operation of the row driver circuit of the present invention is now described in reference to FIGS. 1 and 2. The purpose of a row driver circuit is to charge the row line selected by the address input to the circuit. When the row decoder circuit 36 has not been selected by the address bits supplied to it, the output of circuit 36 will be at a low level as shown by the left-hand side of the waveform for node 37 in FIG. 2. When node 37 is at a low level the output of inverter 92 will be at a high level which will cause the pull down transistors 94–100 to be driven to a conductive state. When the pull down transistors are conductive each of the corresponding row lines is affirmatively connected to ground. When the row line is held at ground potential none of the access transistors for the memory cells are activated and there can be no access to the memory cells.

The address buffer 16 receives a first address bit and produces the positive and complement of that bit on lines 18 and 20. These bit states are transmitted from the address buffer 16 to the row decoder circuit 36. In a like manner each of the address bits in the first set are received at an address buffer corresponding to buffer 16 and the outputs of the buffers are supplied to the row decoder circuit 36.

The row decoder circuit 36 is fabricated to be responsive to only one combination of input signals. When this combination of input signals is received, the circuit 36 generates a drive signal which is at a high state as indicated by the high state of node 37 in FIG. 2 at the right-hand side of the waveform.

The address buffer 16 is connected to a transition detector circuit 24 through lines 26 and 28. The detector circuit 24 generates an output whenever there is a change in state of the address bit $A_i$. Such a transition detector is likewise provided for each of the address buffers which receive the remaining bits in a first set of address bits. The outputs of the transition detectors, such as detector 24, are connected in common at node 30. Each of the transition detector circuits generates a negative going active state which has a preset time duration following a change in state of the address bit. This fixed duration transition signal is input to the inverter 38 which produces an inverted and slightly time delayed transition signal at node 39. The signal produced at node 39 is utilized to precharge the amplifier 42.

The output of inverter 38 is connected to the input of inverter 40 to produce the signal shown for node 41. The output of inverter 40 is connected to the input of amplifier 42 and to the input of inverter 70. The output of amplifier 42 at node 43 is provided to the clock decoder circuit 44. The decoder circuit 44 produces one of the clock signals $\phi_A-\phi_D$ at the time of occurrence of the rising edge of the transition signal supplied through node 43. The selection of the clock signal is determined by the input address bits $A_k$ and $A_l$ which are included in the second set of address bits which are different from the address bits which generate the signals on lines 22 to the row decoder. The address buffers associated with the second set of address bits also have transition detectors whose outputs are connected in common with the outputs of the transition detectors associated with the first set of address bits at node 30.

The inverter 70 produces a positive going transition signal at node 69 as shown in FIG. 2. This transition signal is provided to the source terminal of transistor 66. When the transition signal is not in the active state (high) node 69 is held at ground potential. When the row decoder circuit 36 is selected and node 37 is driven to a high level transistor 66 will be rendered conductive to effectively connect nodes 68 and 69. Thus when the row detector circuit 36 is selected, node 68 will be pulled to a low level if node 69 is at a low level and node 68 will be driven to a high level if node 69 is at a high level. The depletion mode transistor 71 is connected to function as an impedance between the voltage source $V_{cc}$ and node 68. When the row decoder circuit 36 is not selected node 68 is pulled to $V_{cc}$ by device 71, thus connecting the gates of the row driver transistors 80–86 to the low output node 37 of the unselected row decoder 36 through devices 72–78. This turns off the row driver transistors for the unselected rows.

When the row decoder circuit 36 has been selected and node 37 is driven to a high level and the active state of the transition signal is produced to drive node 69 to a high level, a high level signal will be transferred to node 68 which serves to render conductive the isolation transistors 72–78. When these isolation transistors are in a conductive state the gate terminals of row driver transistors 80–86 are connected to the output node 37 of the row decoder circuit 36. After node 37 has been driven to a high level the gate terminals of the row driver transistors will likewise be charged to a high level. Since the transition signal has only a limited time duration node 69 will be returned to ground potential thereby pulling down node 68 which deactivates the isolation transistors 72–78. This action serves to trap the high level charge on the gate terminals of the row driver transistors 80–86.

The address bits within the second set of such bits are provided to the clock decoder circuit 44 which produces one of the clock signals $\phi_A-\phi_D$ when the transition signal is received through node 43. One of the clock signals is normally at a high level while all other clock signals are normally at a low level. At the time of receiving the leading (falling) edge of the transition signal the clock signal which is at a high level is reset to a low level so that all clock signals $\phi_A-\phi_D$ are at low levels. At the time of receiving the trailing (rising) edge of the transition signal one of the clock signals, as determined by the second set of address bits, is driven to a high level.

The clock signals are connected to respective row driver transistors. Assume, for example, that clock signal $\phi_C$ is driven to a high level. The clock signal drives the drain terminal of row driver transistor 84 to a high level and due to the capacitive coupling between the gate and drain and gate and source terminals of transistor 84 the gate terminal of the transistor is driven from the precharged level to a level above the supply voltage, $V_{cc}$. This level is greater than the amplitude of the supply voltage plus the threshold voltage of the row driver transistor 84. The active state of the clock signal is at approximately the supply voltage. Therefore, the row line 106 is driven to a voltage level which is approximately the supply voltage. If it were not for the capacitive coupling between the terminals of transistor 84 the row line 106 could be driven only up to within one threshold voltage of the supply voltage. But by driving the row line 106 to the full supply voltage the access transistors for the memory cells are affirmatively rendered conductive to enable the transfer of a full charge into the storage elements of the memory cell. Likewise it makes possible the transfer of the maximum charge possible to the column lines for reading the state of the memory cell.

The resistor 114 is provided to maintain the row line 106 at the charged level by supplying leakage current which would normally be lost due to the junction leakage associated with the source region of transistor 84 and the drain region of transistor 98. Similar resistors are provided for each of the other row lines in the circuit 10. These resistors have a sufficiently large impedance such that there is very little current flow when the row line is held at ground potential.

In summary, the present invention provides a row driver circuit which reduces the capacitive loading on the row decoder circuit while providing the full supply voltage to the row line by the bootstrapping effect achieved with precharging the gate terminals of the row driver transistors.

Although one embodiment of the invention has been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. A row driver circuit for driving row lines in a semiconductor memory, comprising:
   a row driver transistor for each of the row lines of the semiconductor memory, each of the row driver transistors having a drain terminal, a source terminal and a gate terminal, the source terminal of each row driver transistor connected to the corresponding row line;
   a row decoder circuit connected to receive a plurality of first address bits for generating a drive signal when said row decoder is selected by said first address bits;
   a transition detector circuit connected to receive address bits provided to said semiconductor memory for generating a transition signal upon a change of state for any one of said address bits;
   means responsive to said drive signal and said transition signal for precharging the gate terminals of a group of said row driver transistors corresponding to said row decoder circuit; and
   means for decoding a plurality of second address bits to generate a clock signal for transfer to the drain terminal of a selected one of the row driver transistors within said group such that the clock signal is capacitively coupled to increase the voltage on the precharged gate terminal to thereby charge the row line connected to the selected row driver transistor.

2. The row driver circuit recited in claim 1 wherein said means for decoding a plurality of second address bits comprises a clock decoder circuit connected to receive said second address bits and said transition signal for generating one of a plurality of clock signals, said clock signals connected for transmission respectively to the drain terminals of the row driver transistors within said group.

3. A row driver circuit for driving row lines in a semiconductor memory, comprising:
   a row driver transistor for each of the row lines of the semiconductor memory, each of the row driver transistors having a drain terminal, a source terminal and a gate terminal, the source terminal of each row driver transistor connected to the corresponding row line;
   a row decoder circuit for receiving a plurality of first address bits and generating a drive signal at the output terminal thereof when said row decoder circuit is selected by said first address bits;
   a transition detector circuit connected to receive said first address bits for generating a transition signal having a preset duration active state upon detection of a change of state for any one of said first address bits;
   means responsive to said drive signal for holding at a fixed potential a group of row lines corresponding to said row line decoder;
   means responsive to said transition signal for selectively connecting the output terminal of said row decoder to the gate terminals of a corresponding group of said row driver transistors wherein the gate terminals of said row driver transistors are charged when said first address bits select said row decoder circuit and the active state of said transition signal is generated; and
   a clock generator circuit connected to receive a plurality of second address bits for generating any one of a plurality of clock signals at respective output terminals of said clock generator circuit, said output terminals connected respectively to the drain terminals of said row driver transistors within said group for capacitively coupling the voltage on the precharged gate terminals of the corresponding row driver transistor to charge the corresponding row line to at least the voltage of the clock signal.

4. The row driver circuit recited in claim 3 wherein said means responsive to said drive signal for holding at a fixed potential comprises:
   an inverter circuit having an input and an output terminal, the input terminal thereof connected to the output terminal of said row decoder circuit; and
   a pull down transistor for each of said row lines, each of said pull down transistors having the drain terminal thereof connected to the corresponding row line, the source terminals thereof connected to a common node and the gate terminals thereof connected to the output terminal of said inverter.

5. The row driver circuit recited in claim 3 wherein said means responsive to said transition signal for selectively connecting comprises:
   a first transistor having the gate terminal thereof connected to the output terminal of said row decoder; the drain terminal thereof coupled through an impedance element to a fixed voltage node, and the source terminals thereof connected to receive said transition signal; and
   an isolation transistor for each of said row lines, each of said isolation transistors having the drain terminal thereof connected to the output terminal of said row decoder circuit, the source terminal thereof connected to the gate terminal of the corresponding row driver transistor and the gate terminal thereof connected to the drain terminal of said first transistor.

6. A row driver circuit for driving row lines in a semiconductor memory, comprising:
   a row driver transistor for each of the row lines of the semiconductor memory, each of the row driver transistors having a drain terminal, a source terminal and a gate terminal, the source terminal of each row driver transistor connected to the corresponding row line;
   a row decoder circuit for receiving a plurality of first address bits and generating a drive signal at the output terminal thereof when said row decoder circuit is selected by said first address bits;
   a transition detector circuit for each of said first address bits, said transition detector circuits connected to receive said first address bits and generate a transition signal having a preset duration active state upon detection of a change of state for any one of said first address bits;

an inverter circuit having an input and an output terminal, the input terminal thereof connected to the output terminal of said row decoder circuit;

a pull down transistor for each of said row lines, each of said pull down transistors having the drain terminal thereof connected to the corresponding row line, the source terminals thereof connected to a common node and the gate terminals thereof connected to the output terminal of said inverter;

a first transistor having the gate terminal thereof connected to the output terminal of said row decoder, the drain terminal thereof coupled through an impedance element to a fixed voltage node, and the source terminals thereof connected to receive said transition signal;

an isolation transistor for each of said row lines, each of said isolation transistors having the drain terminal thereof connected to the output terminal of said row decoder circuit, the source terminal thereof connected to the gate terminal of the corresponding row driver transistor and the gate terminal thereof connected to the drain terminal of said first transistor; and a clock decoder circuit connected to receive a plurality of second address bits for generating any one of a plurality of clock signals at the respective output terminals thereof, said output terminals connected respectively to the drain terminals of said row driver transistors for capacitively coupling the voltage on the precharged gate terminals of the corresponding row driver transistor to activate the corresponding row driver transistor to charge the corresponding row line to the voltage of the clock signal.

* * * * *